(12) United States Patent
Mrad et al.

(10) Patent No.: US 11,791,254 B2
(45) Date of Patent: Oct. 17, 2023

(54) ELECTRICALLY POWER ASSEMBLY WITH THICK ELECTRICALLY CONDUCTIVE LAYERS

(71) Applicant: MITSUBISHI ELECTRIC CORPORATION, Tokyo (JP)

(72) Inventors: Roberto Mrad, Rennes (FR); Stefan Mollov, Rennes (FR)

(73) Assignee: Mitsubishi Electric Corporation, Tokyo (JP)

( * ) Notice: Subject to any disclaimer, the term of this patent is extended or adjusted under 35 U.S.C. 154(b) by 267 days.

(21) Appl. No.: 17/431,916

(22) PCT Filed: Jan. 20, 2020

(86) PCT No.: PCT/JP2020/002641
§ 371 (c)(1),
(2) Date: Aug. 18, 2021

(87) PCT Pub. No.: WO2020/195089
PCT Pub. Date: Oct. 1, 2020

(65) Prior Publication Data
US 2022/0148958 A1 May 12, 2022

(30) Foreign Application Priority Data
Mar. 25, 2019 (EP) .................................. 19164827

(51) Int. Cl.
*H01L 23/498* (2006.01)
*H01L 21/48* (2006.01)
(Continued)

(52) U.S. Cl.
CPC .... *H01L 23/49844* (2013.01); *H01L 21/4857* (2013.01); *H01L 23/13* (2013.01);
(Continued)

(58) Field of Classification Search
CPC ........... H01L 23/49844; H01L 21/4857; H01L 23/13; H01L 23/49822; H01L 25/072;
(Continued)

(56) References Cited

U.S. PATENT DOCUMENTS

2002/0108776 A1    8/2002    Uchikawa et al.

FOREIGN PATENT DOCUMENTS

| EP | 2854168 A2 | 4/2015 |
| EP | 2854168 A3 | 8/2015 |

(Continued)

*Primary Examiner* — Selim U Ahmed
*Assistant Examiner* — Evan G Clinton
(74) *Attorney, Agent, or Firm* — Birch, Stewart, Kolasch & Birch, LLP

(57) ABSTRACT

An electrical power assembly, comprising: at least one multilayer base structure, at least one power device embedded in the at least one multilayer base structure, an internal electrically conductive layer positioned on each side of the multilayer base structure, the internal electrically conductive layer being connected to a respective electrical contact of the power device through connections arranged in the multilayer base structure; at least one external electrically conductive layers positioned on each side of the base structure, each external electrically conductive layer comprising at least one pre-drilled through hole, at least one internal electrically insulating layer positioned between the internal electrically conductive layer of the base structure and a respective external electrically conductive layer, at least one hole arranged in the internal electrically insulating layer and the external electrically conductive layer, a portion of each hole being formed by the pre-drilled through hole, the at least one hole being filled with electrically conductive material to form external conductive vias to connect the internal electrically conductive layer to the respective external electrically conductive layer.

15 Claims, 15 Drawing Sheets

(51) Int. Cl.
*H01L 23/13* (2006.01)
*H01L 25/07* (2006.01)
*H01L 25/18* (2023.01)
*H01L 25/00* (2006.01)

(52) U.S. Cl.
CPC ...... *H01L 23/49822* (2013.01); *H01L 25/072* (2013.01); *H01L 25/18* (2013.01); *H01L 25/50* (2013.01)

(58) Field of Classification Search
CPC ..... H01L 25/18; H01L 25/50; H01L 23/5383; H01L 23/5384; H01L 24/25; H01L 2224/04105; H01L 2224/06181; H01L 2224/2518; H01L 23/5389; H05K 1/188; H05K 3/4652; H05K 2201/09554; H05K 2201/10166; H05K 2203/0323; H05K 1/0263

See application file for complete search history.

(56) References Cited

FOREIGN PATENT DOCUMENTS

| | | | |
|---|---|---|---|
| EP | 3148300 A1 | 3/2017 | |
| EP | 3252812 A2 | 12/2017 | |
| EP | 3252812 A3 | 5/2018 | |
| WO | WO-2019187400 A1 * | 10/2019 | ......... H01L 21/4846 |

\* cited by examiner

ELECTRICALLY POWER ASSEMBLY WITH THICK ELECTRICALLY CONDUCTIVE LAYERS

TECHNICAL FIELD

The invention relates to an electrically power assembly comprising at least one power device embedded in a multilayer base structure and at least one external thick electrically conductive layer providing better current and thermal transfer of the power device. The invention also relates to a manufacturing method of the power assembly.

BACKGROUND ART

Power dies, such as diodes or various types of power transistors (MOSFET, JFET, IGBT, HEMT) are elementary components of power modules which are used for the control and conversion of electric power, for instance in many different fields such as in the automotive, aeronautic, railway industries.

Currently the most common way to connect a power die to other components, for instance in a power module, is by using a substrate such as a Direct Bonded Copper (DBC) Substrate, which comprises a ceramic plate with at least one side covered with a copper layer. Power dies are soldered or sintered on the DBC substrate on one side, and connected on the other side of the power die by wire bonds or ribbons that are ultrasonically welded on the die metallization.

The constant increase in the switching frequency and density of power leads a need for thermal enhancement, volume reduction and reliability increase of the power modules.

In this perspective, the traditional power connection by wire bonding of a power die on a substrate has a number limitations and drawbacks, among which the high parasitic level and low reliability due to wire bonds.

A new packaging technology is emerging which consists of manufacturing pre-packed power cells comprising at least one power die embedded in a Printed Circuit Board (PCB) laminate. The power dies are then connected to electrically conductive layers through plated vias.

This new packaging solution allows easier connection of the power dies on a substrate. In addition, the connection by plated vias increases the reliability and reduces the parasitic elements of the interconnection.

A conventional method for manufacturing a power device packaging comprises the following steps:
  forming a cavity of the size of the power die in an electrically insulating core,
  inserting a power device in the cavity,
  positioning the electrically insulating layer comprising the power device between two additional electrically insulating layer, to obtain a stack of electrically insulating layers,
  positioning the stack of electrically insulating layers between two external electrically conductive layers,
  laminating the stack of electrically insulating layers and the external electrically conductive layers,
  drilling plural via holes by laser,
  plating the vias hole in order to connect the contact pads of the external electrically conductive layers to the respective electrical contact of the power die,
  increasing the thickness of the external electrically conductive layers by plating to required thickness according to the needs of the power electronic applications in order to increase power and thermal transmission.
  patterning the surface of the external electrically layers in order to form a desired layout.

However, in such power device packaging structure, in order to obtain higher thermal and electrical performances of the power devices, it is preferable to have vias filled with copper and a thick copper layer on the package structure. Therefore, the step of plating the vias is longer in order to reach the required thickness for the two electrically conductive layers. Such method makes the process costly.

The other solution is to obtain in first a thick external electrically layers before performing the step of drilling the vias. However, there is another problem which resides in the drilling laser capabilities which are limited in thick electrically conductive layers.

Therefore, there is a need of providing an improved package structure in order to eliminate the above drawbacks.

SUMMARY OF INVENTION

In view of the above, the invention aims at providing a power assembly with thick electrically conductive layers in order to increase the thermal and power capabilities of the power device.

Another aim of the invention is to provide a power assembly which is easier to manufacture than in the prior art.

Accordingly, a power assembly is disclosed, comprising:
  at least one multilayer base structure, at least one power device embedded in the at least one multilayer base structure, an internal electrically conductive layer positioned on each side of the multilayer base structure, each internal electrically conductive layer comprising at least one contact pad connected to a respective electrical contact of the power device through connections arranged in the multilayer base structure;
  at least one external electrically conductive layers positioned on each side of the base structure, each external electrically conductive layer comprising at least one pre-drilled through hole,
  at least one internal electrically insulating layer positioned on at least one side of the base structure, said internal electrically insulating layer being positioned between the internal electrically conductive layer of the base structure and a respective external electrically conductive layer,
  at least one hole extending from a contact pad of the internal electrically conductive layer to the external surface of the external electrically conductive layer in such that the hole has a bottom formed by a contact pad of the internal electrically conductive layer, a portion of each hole being formed by the pre-drilled through hole,
  the at least one hole being filled with electrically conductive material from the bottom of the hole to the external surface of the external electrically conductive layer in order to form external conductive vias to connect the contact pad of the internal electrically conductive layer to the respective external electrically conductive layer.

The power assembly according to the invention provides an enhanced power transmission thanks to the thick external conductive layers that are positioned on opposite sides of the multilayer base structure embedded the power device.

In embodiments, said at least one multilayer base structure comprises:
  an electrically insulating core,
  at least one power device embedded in the electrically insulating core, each power device having opposite electrical contacts, two internal electrically conductive layers on opposite surfaces of the electrically insulating core,
each internal electrically conductive layers comprising at least one contact pad connected to a respective electrical contact of the power device through connections arranged in the electrically insulating core and in the internal conductive layers.

Preferably, the thickness of the external layers is in a range of between 100 µm to 4 mm, and preferably 400 µm to 1 mm.

The at least one hole has a ratio hole depth to pre-drilled hole diameter in range of between 0.4 to 1.6, and preferably 0.8 to 1.2.

In embodiments, the connections between an internal electrically conductive layer and an electrical contact of a power device are conductive vias.

Preferably, the diameter of the at least one hole is in a range of between 100 µm to 1500 µm.

In embodiments, the at least one power device is a diode, a transistor such as a MOSFET, JFET or IGBT.

A method for manufacturing a power assembly according to the above description is also disclosed, comprising:
(a) forming a multilayer base structure, at least one power device embedded in the at least one multilayer base structure, an internal electrically conductive layer positioned on each side of the at least one base structure, each internal electrically conductive layer comprising at least one contact pad connected to a respective electrical contact of the power device through connections arranged in the multilayer base structure;
(b) providing two external electrically conductive layers, the external electrically conductive layers having at least one pre-drilled through hole;
(c) positioning an external electrically conductive layer on each side of the base structure and positioning at least one internal electrically insulating layer between the internal electrically conductive layer of the base structure and the external electrically conductive layer on at least one side of the base structure;
(d) laminating the base structure, the internal electrically insulating layers and the external electrically conductive layers;
(e) forming at least one hole by removing a stack comprising a portion of the internal electrically insulating layer and a portion of the material filling the at least one pre-drilled through hole, such that the at least one hole has a bottom formed by a contact pad of the internal electrically conductive layer;
(f) filling the at least one hole with electrically conductive material in order to form the external conductive vias to connect the contact pad of the internal electrically conductive layer of the multilayer base structure to the external electrically conductive layer,
g) patterning the surface layers of external electrically conductive layers in order to form conductive patterns.

In embodiments, the step of forming the multilayer base structure comprises:
forming at least one cavity in an electrically insulating core,
inserting at least one power device in each cavity,
positioning two internal electrically conductive layers on opposite surfaces of the electrically insulating core,
laminating the electrically insulating core and the internal electrically conductive layers,
forming holes in the electrically insulating core and in the internal electrically conductive layers,
plating the holes in order to connect the at least one contact pad of the internal electrically conductive layers to a respective electrical contact of the power device,
patterning the surface layers of internal electrically conductive layers in order to form conductive patterns.

The method may comprise further steps wherein the sequence of steps (b) to (g) is repeated at least once.

In embodiments, the sequence of steps (b) to (g) is repeated a number of times necessary to obtain a total thickness for the external conductive layers on each side of the base structure comprising between 1 mm and 100 mm.

Preferably, each external electrically conductive layer has a thickness in a range of between 100 µm to 4 mm, and preferably 400 µm to 1 mm.

In embodiments, the at least one pre-drilled through hole of the external electrically conductive layers is pre-filled with a paste insulating material before positioning the external electrically conductive layers on each side of the base structure.

The paste material is choosing among the group consisting of: epoxy resin, silicon.

The at least one hole have a ratio vias hole depth to pre-drilled hole diameter ranging between 0.4 to 1.6, and preferably between 0.8 to 1.2.

The power assembly according to the invention provides a good thermal dissipation and a high power transmission thanks to the thick external electrically conductive layers positioned on each side of the multilayer base structure.

In addition, the use of pre-drilled holes formed in the thick electrically conductive layers before lamination permits to drill the thick electrically conductive layers by mechanical process or any appropriate process and overcome the laser drilling limitation.

BRIEF DESCRIPTION OF DRAWINGS

Other features and advantages of the invention will be apparent from the following detailed description given by way of non-limiting example, with reference to the accompanying drawings, in which.

DESCRIPTION OF EMBODIMENTS

In this disclosure, the term "electrical power assembly" refers to a package structure comprising at least one power device embedded in a multilayer structure like a PCB laminate in order to form a power module. In this disclosure, the term "insulating layer" or "insulating core" refers to a layer or core made of thermally conductive and electrically insulating material. In this disclosure, the term "conductive layer" refers to a layer made of electrically and thermally conductive material.

With reference to FIG. 1A to FIG. 1G, an electrical power assembly 100 according to a first embodiment of the invention will now described.

Figure 1A:
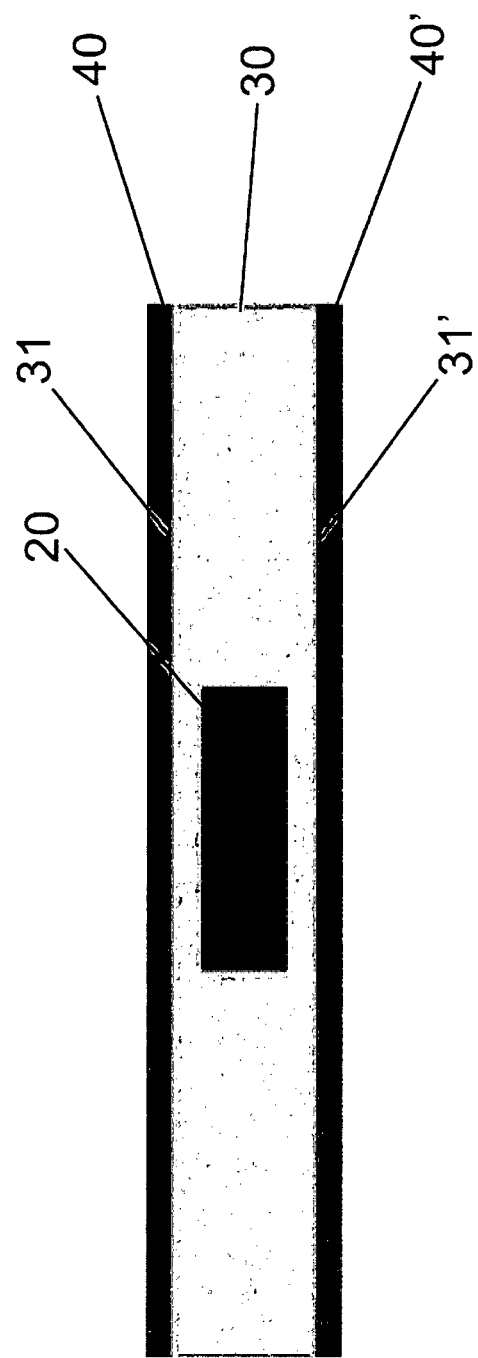
FIG. 1A is schematic cross-sectional views of an electrical power assembly according to a first embodiment of the invention.
Figure 1B:
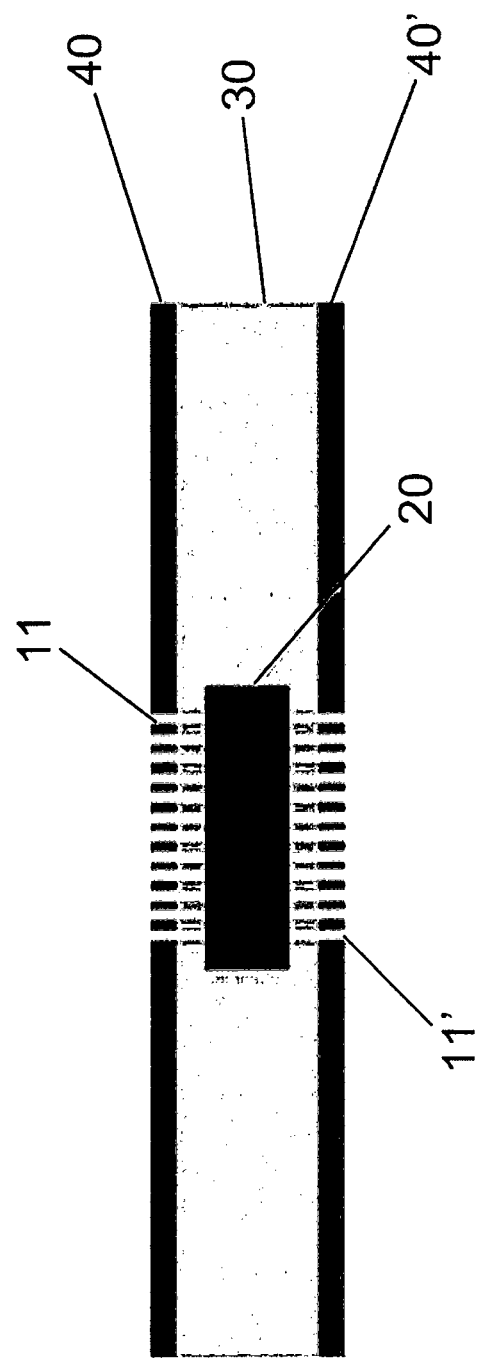
FIG. 1B is schematic cross-sectional views of an electrical power assembly according to a first embodiment of the invention.
Figure 1C:
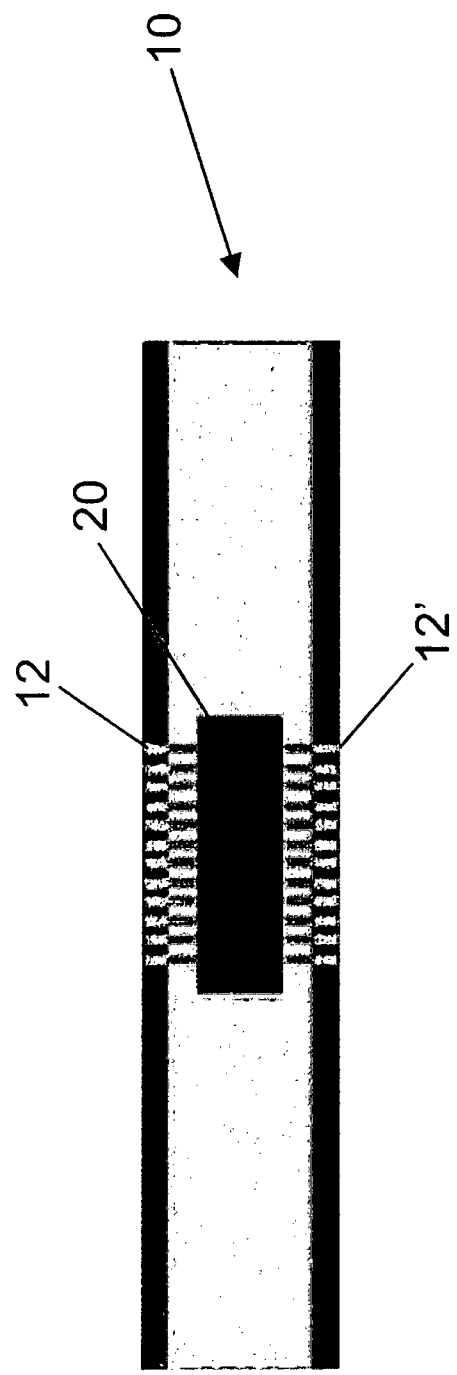
FIG. 1C is schematic cross-sectional views of an electrical power assembly according to a first embodiment of the invention.

Referring to FIGS. 1A to 1C, the power assembly 100 comprises an insulating core 30, in which is embedded a power device 20. The power device may be a diode or a MOSFET, a JFET or IGBT, HEMT. In some embodiments, the power device is made from a wide bandgap semiconductor, i.e. a semiconductor having a bandgap in the range of 2-4 eV. For instance, the power device may be made in Silicon Carbide SiC or in Gallium Nitride GaN.

The power device has at least two electrical contacts (not shown) which are metallic pads such as aluminum, gold, copper, silver etc.

For instance, the power device is a diode and has two opposite electrical contacts. In another example, the power device is a transistor and has three electrical contacts comprising a gate, a source and a drain or a gate, an emitter and a collector, according to the type of transistor. The power device could also have a number of electrical contacts greater than three.

Figure 2:
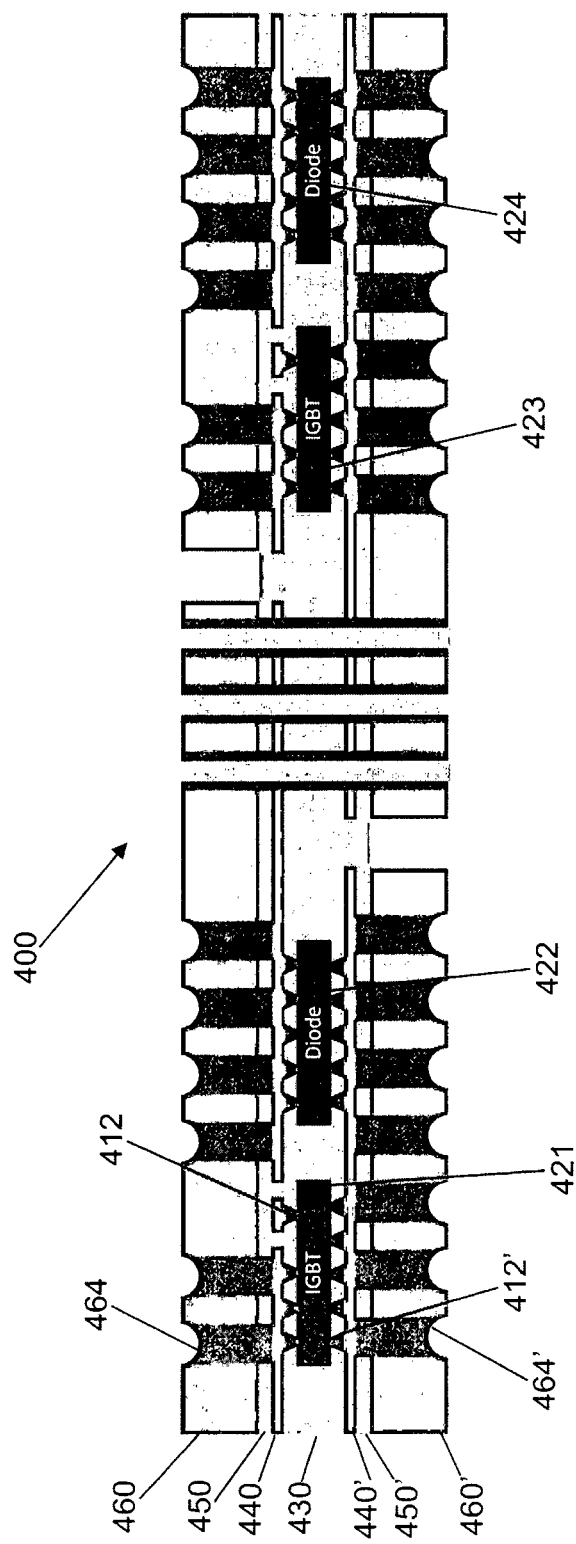
FIG. 2 is a schematic cross-sectional view of an electrical power assembly according to a second embodiment of the invention.

In addition, the power assembly 100 may comprise at least one additional power device as shown in FIG. 2 and/or an electronic passive component such as a resistor, a capacitor, or other, connected to the first power device.

As non-limiting examples, the insulating core 30 is made of resin or any other appropriate insulating material with high thermal conductivity to provide better heat dissipation. The insulating core may be made of FR-4 glass epoxy, polyimide, or in ceramic such as HTCC (High-Temperature Co-Fired Ceramic) or LTCC (Low Temperature Co-fired Ceramic).

In addition, the electrical power assembly 100 further comprises a top internal conductive layer 40 and a bottom internal conductive layer 40'. The top internal conductive layer 40 is disposed on a top surface 31 of the insulating core 30. The bottom internal conductive layer 40' is disposed on a bottom surface 31' of the insulating core 30. The material of these conductive layers is a metal, preferably copper.

Moreover, a set of top conductive vias 12 and a set of bottom vias 12' are formed in the insulating core 30 and in the top and bottom internal conductive layers 40, 40'. The contact pads of the top internal conductive layer 40 are connected to the electrical contacts on a top surface of the power device 20 by the set of top vias 12. The contact pads of the bottom internal conductive layer 40' are connected to the electrical contacts on a bottom surface of the power device by the set of bottom vias 12'. The power device 20 is therefore connected to the top internal conductive layer 40 and the bottom internal conductive layer 40' through the electrical pads, the set of top vias 12 and the set of bottom vias 12'.

The method of forming the top vias 12 and the bottom vias 12' are well known to those skilled in the art. After laminating the stack up comprising the insulating core 30 and the two internal conductive layers 40, 40' in order to obtain a solid assembly, a set of bottom vias holes 11 and a set of bottom vias holes 11' are formed by laser drilling process at each side of the stack allowing the exposition of the electrical contacts of the power device 20. Then, the vias holes 11, 11' are filled with a conductive material such as copper by an electroplating process or electroless or both in order to form conductive vias 12, 12'.

Moreover, an etching step is applied on the surface of the top conductive layer 40 and the surface of the bottom conductive layer 40' in order to obtain respectively top conductive pattern and bottom conductive pattern. Therefore, the top conductive pattern and the bottom conductive pattern are served as the contact pads of the top internal conductive layer 40 and the bottom internal conductive layer 40'.

According to a non-limiting embodiment, the internal conductive layers 40, 40' may have a thickness of about 20-50 µm.

The number of the vias is chosen according to the power transmission. These numbers depend also on the drilling technique, laser or mechanical. For instance, the density of vias connecting the electrical contact of the power device with the internal conductive layers may be at least 4 vias/mm$^2$, for instance 15 vias/mm$^2$, for instance with a ratio vias hole depth to drill diameter of 0.8. In another example wherein the power device is a MOSFET or IGBT, only one via connects the gate pad to the internal conductive layer.

The package structure as described above forms an example of multilayer base structure 10 comprising the insulating core 30 and two thin internal conductive layers 40, 40' covering opposite surfaces of the insulating core 30, the insulating core 30 embedded at least one power device 20.

Referring to FIGS. 1D to 1G, the power assembly 100 further comprises a top thick external conductive layer 60 and a bottom thick external conductive layer, 60' positioned at each side of the base structure 10. The top and bottom thick external conductive layers have a thickness greater than the thickness of the internal conductive layers 40, 40' of the base structure in order to enhance the current and thermal capabilities of the package structure. According to a non-limiting embodiment, the thick external conductive layers 60, 60' may have a thickness of about 100 µm-4 mm, preferably about 400 µm-1 mm. Thus, a thick layer is a layer having a thickness greater than or equal to 100 μm. The material of these layers is metal, preferably copper.

Figure 1D:
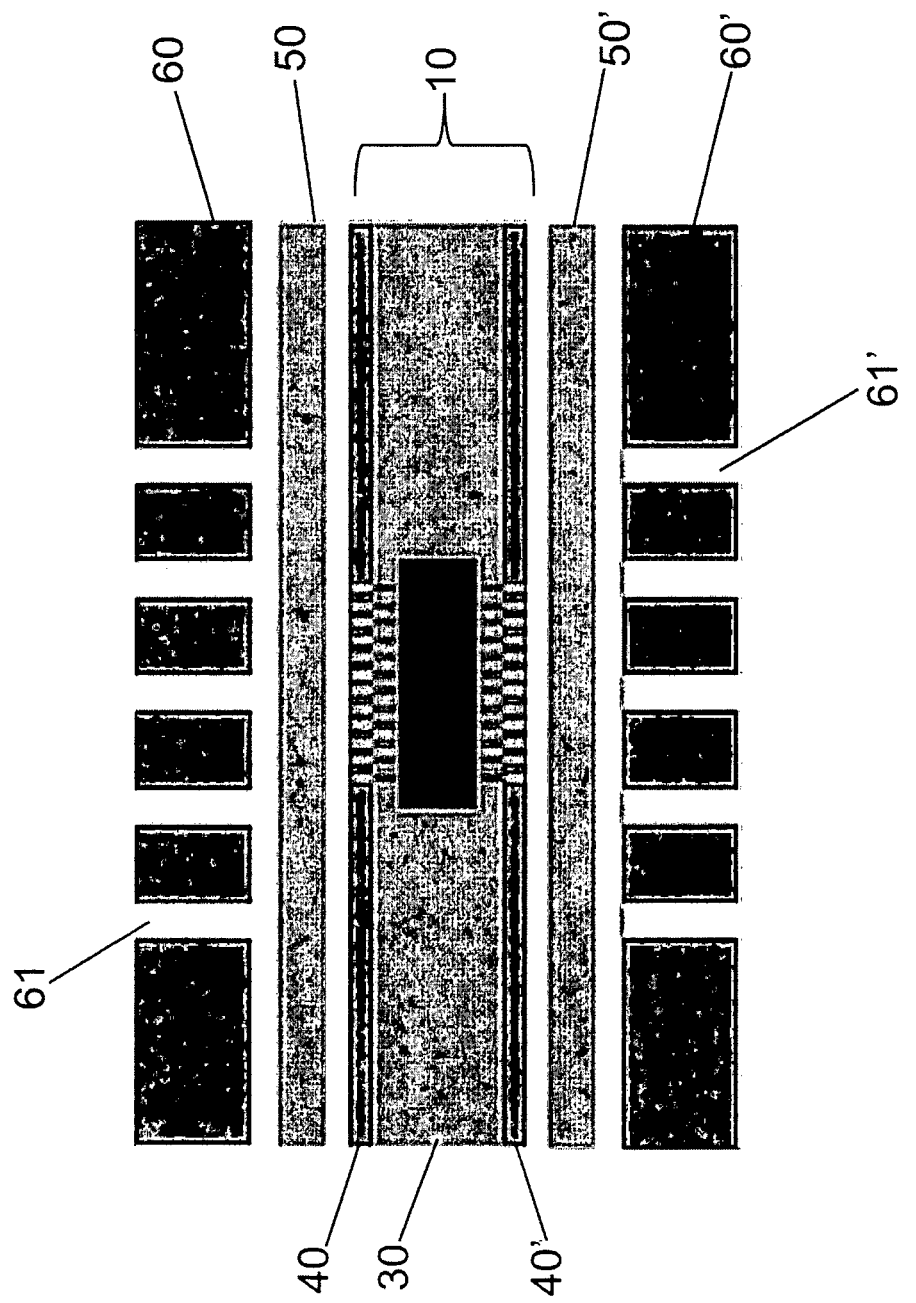
FIG. 1D is schematic cross-sectional views of an electrical power assembly according to a first embodiment of the invention.

As shown in FIG. 1D, each external thick electrically conductive layer 60, 60' comprises plural pre-drilled through holes 61, 61' which are formed by mechanical process or other such as an electroerosion. These predrilled through holes 61, 61' are served as conductive vias holes for connecting the external thick conductive layers 60, 60' to the contact pads of the internal conductive layers 40, 40' as will be explained in more detail below.

By pre-drilled through holes it is understood that the holes are formed in the thick conductive layers prior to positioning the thick layers in the stack for forming the power assembly, e.g. prior to the step of lamination of the stack. Therefore, there is no limitation on the drilling technique. Thus and advantageously, the holes are formed by a mechanical drilling process in order to form deep holes. Typically, the pre-drilled through holes may have a hole diameter comprising between 100 μm and 1500 μm.

In an embodiment, these pre-drilled through holes 61, 61' are pre-filled with an insulating material by screen printing which will be removed later prior the step of electroplating process for forming conductive vias.

Moreover, the power assembly 100 further comprises a top internal insulating layer 50 and a bottom internal insulating layer 50', the top internal insulating layer 50 being disposed between the top external thick conductive layer 60 and the top internal thin electrically conductive layer 40 of the base structure 10 and the bottom internal insulating layer being 50' being disposed between the bottom external thick conductive layer 60' and the bottom internal conductive layer 40' of the base structure 10. For example, the internal insulating layers 50, 50' are made of resin or any appropriate insulating material with high thermal conductivity.

Figure 1E:
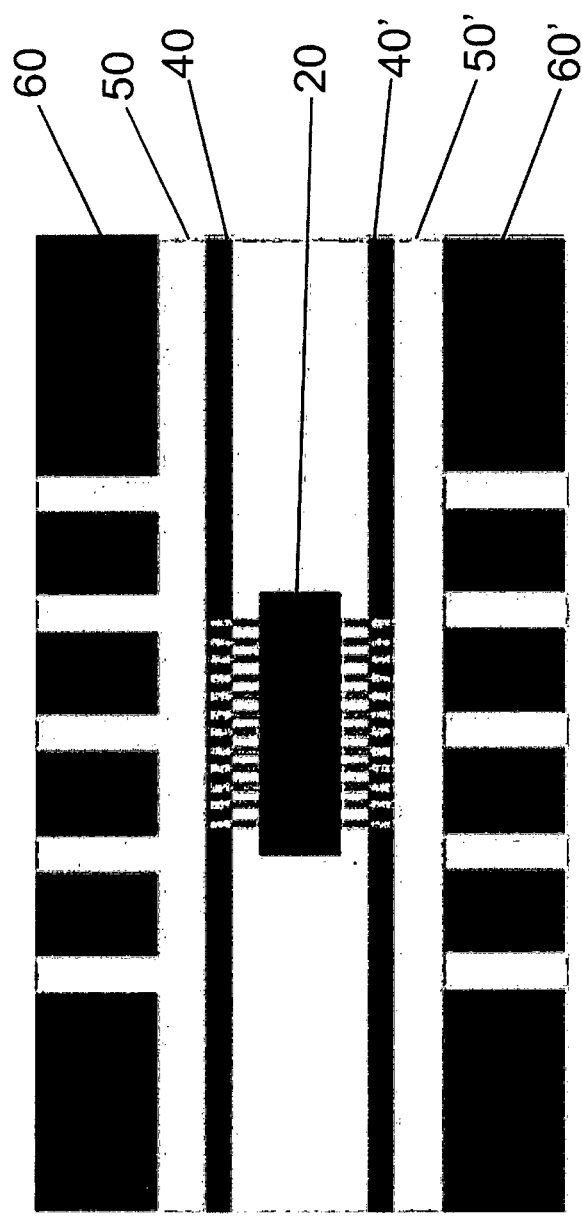
FIG. 1E is schematic cross-sectional views of an electrical power assembly according to a first embodiment of the invention.

Referring to FIG. 1E, during the step of lamination of the stack which comprises the top and bottom insulating layers 50, 50', the top and bottom thick external electrically layers 60, 60' and the base structure 10, the epoxy resin present in the insulating layers 50, 50' flows and fill the pre-drilled through holes 61, 61' of the thick external conductive layers 60, 60'.

The insulating material in the pre-drilled through holes and underneath the pre-drilled through holes is then removed in order to form holes 62, 62' extending from the internal conductive layers 40, 40' to the external surface 65, 65' of the external thick conductive layers 60, 60', through the internal insulating layers 50, 50'.

Figure 1F:
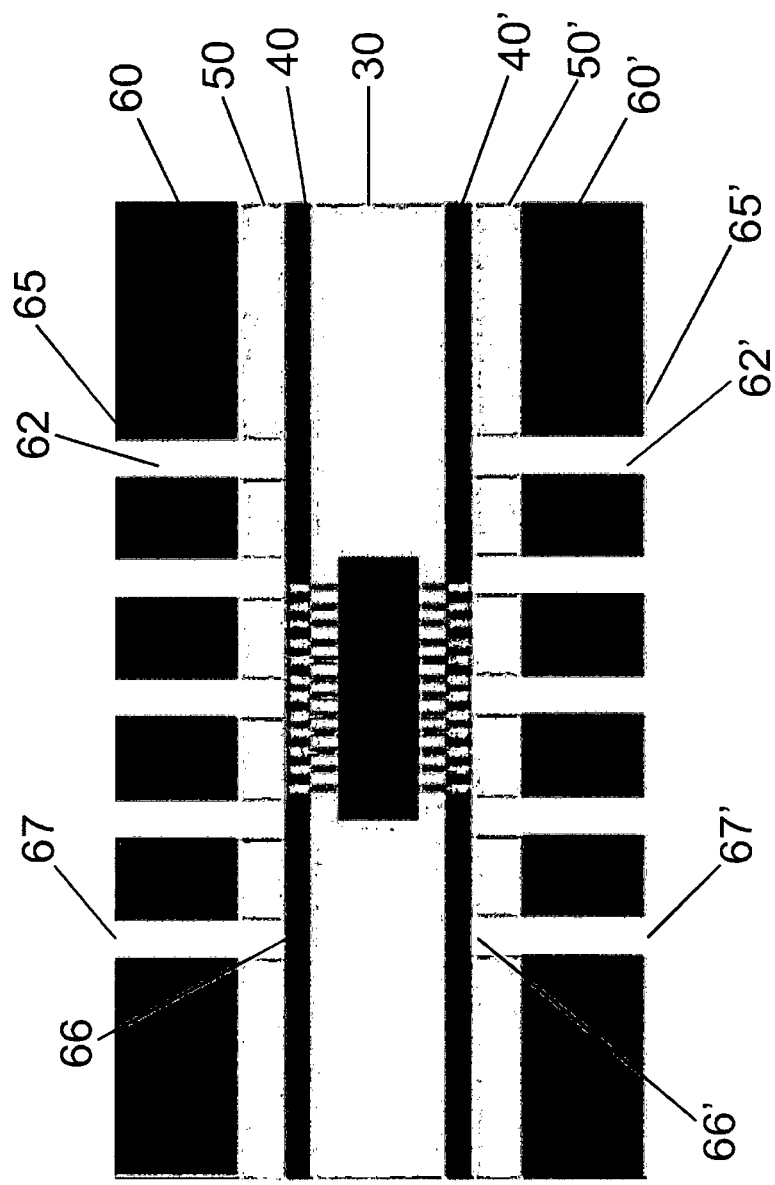
FIG. 1F is schematic cross-sectional views of an electrical power assembly according to a first embodiment of the invention.

As shown in FIG. 1F, the electrical power assembly 100 also comprises a set of top holes 62 extending from the top internal conductive layer 40, through the top insulating layer 50 and the top thick external electrically layer 60 and a set of bottom holes 62' extending from the bottom internal conductive layer 40', through the bottom insulating layer 50' and the bottom thick external electrically layer 60'.

Each hole 62, 62' has a bottom 66, 66' and an open end 67, 67'. The bottom of the hole is formed by a portion of the contact pads of the internal conductive layers 40, 40' which are therefore exposed. The open end 67, 67' is formed at the surface 65, 65' of the external thick electrically conductive layer 60, 60'.

Each hole 62, 62' is formed in part by a hole formed in the internal insulating layers 50, 50' and in part by the pre-drilled through hole 61, 61' formed in the external thick conductive layers 60, 60'. The holes 62, 62' have a ratio vias hole depth to pre-drilled diameter ranging between 0.4 to 1.6, and preferably between 0.8 to 1.2.

Figure 1G:
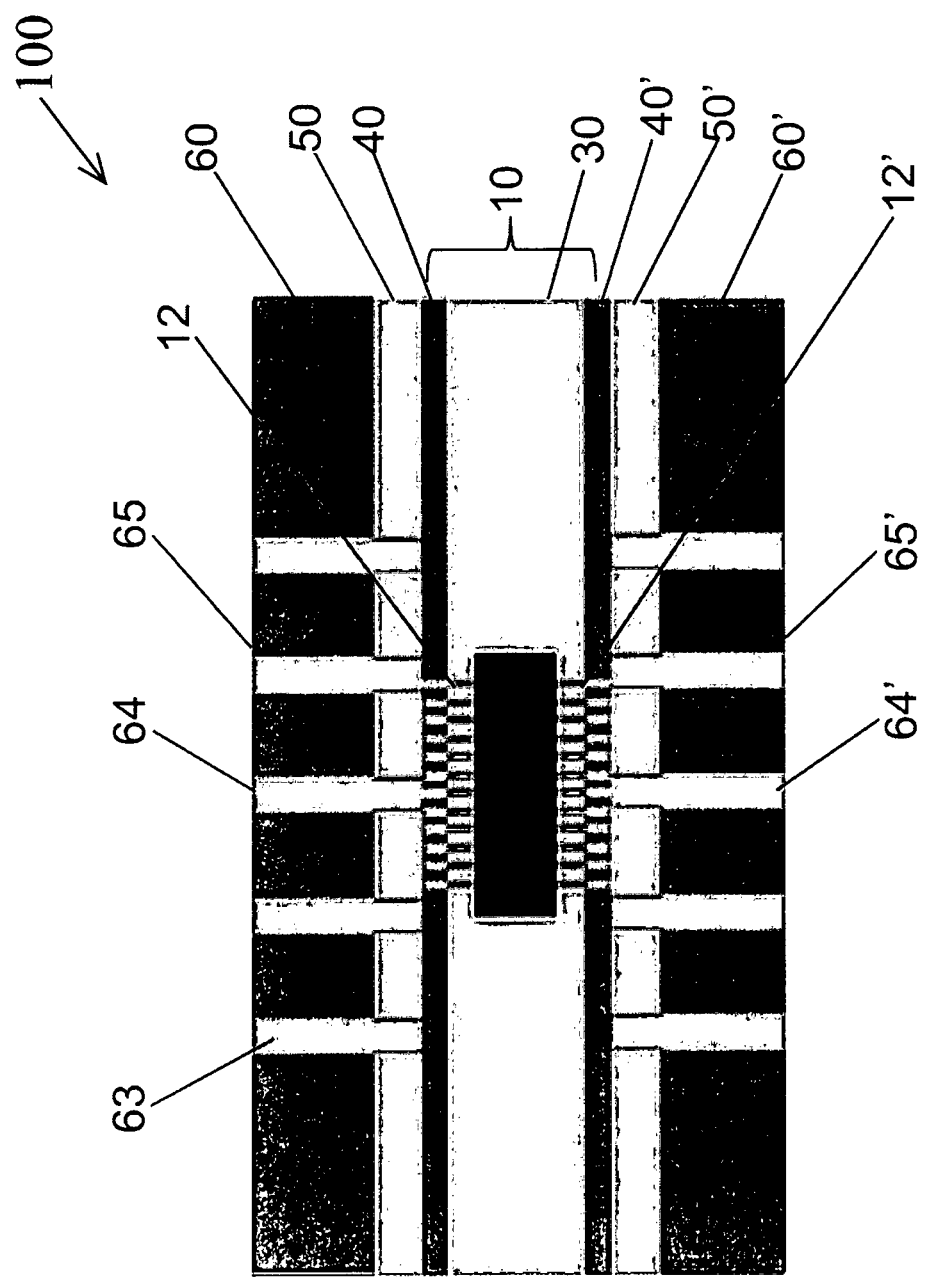
FIG. 1G is schematic cross-sectional views of an electrical power assembly according to a first embodiment of the invention.

Referring to FIG. 1G, the top and bottom holes 62, 62' are then filled with a conductive material 63 such as copper or a paste conductive material in order to form a set of top conductive vias 64 and a set of bottom conductive vias 64'. Preferably, the holes may be fully filled with the conductive material from the bottom of the holes until the surface of the external thick conductive layer. According to another embodiment, the holes 62, 62' are plated by a conductive material. The assembly is dipped into two baths, the first being copper electroless plating in order to connect the internal conductive layers to the external conductive layers, a second being an electroplating bath in order to fully fill the holes 62, 62'.

Therefore the contact pads of the top internal conductive layer 40 are connected to the external thick conductive layer 60 by the top vias 64 arranged in the top internal insulating layer 50 and in the top external conductive layer 60. The contact pads of the bottom internal conductive layer 40' are connected to the bottom external thick conductive layer 60' by the bottom vias 64' arranged in the bottom internal insulating layer 50' and in the bottom external conductive layer 60'.

Consequently, the power device 20 is electrically connected with the top external thick conductive layer 60 and the bottom external thick conductive layer 60'.

FIG. 2 is a schematic cross-sectional view illustrating an electrical power assembly 400 according to a second embodiment of the present invention. In comparison with the first embodiment shown in FIG. 1G, the electrical power assembly comprises plural power devices, for instance four power devices 421, 422, 423 and 424 as shown in FIG. 2. The power devices may same or different with each other. The number of the electrical contacts of each power device is determined according to the type of the power device. For example, as shown in FIG. 2, the power assembly comprises two diodes and two IGBT embedded in respective cavities of the electrically insulating core 430. The diode has two electrical contacts, namely an anode and a cathode, and the IGBT has three electrical contacts, an emitter, a gate and a collector.

The electrical contacts of the top side of each power device are connected to the top external thick conductive layer 460 through the top vias 412 formed in the electrically insulating core 430, the internal thin conductive layer 440, the external top vias 464 formed in the top internal insulating layer 450 and in the top external conductive layer 460. The electrical contacts of the bottom side of each power device are connected to the bottom external thick conductive layer 460' through the bottom vias 412' formed in the electrically insulating core 430, the bottom internal thin conductive layer 440', the external bottom vias 464' formed in the bottom internal insulating layer 450' and in the bottom external conductive layer 460'.

The power devices disposed in the power assembly are not limited to the configuration shown in FIG. 2 and can be varied according to the electronic function required for the power assembly.

Since the external conductive layers disposed on each side of the base structure have a thickness greater than 400 μm, the power transmission efficacy is largely enhanced. Moreover, since the holes of the external thick conductive layers which form the conductive vias are pre-drilled by mechanical process in the thick conductive layers, the manufacturing cost of the power assembly is reduced.

With reference to FIGS. 3A to 3D, an electrical power assembly 200 according to a third embodiment of the present invention will be now described. In comparison with the embodiment shown in FIGS. 1A-1G, there is no bottom electrically insulating layer between the bottom internal thin conductive layer 40' and the bottom external thick conductive layer 60'. In this embodiment, the bottom external thick conductive layer 60' is positioned directly on the bottom internal thin conductive layer 40'. Therefore, components parts and elements corresponding to those of the first embodiment are designated by identical numeral references, and details description therefore is omitted. Thus, the base structure of this embodiment is similar to the base structure of the first embodiment, and is not redundantly described below.

The power assembly 200 comprises a top thick external conductive layer 60 and a bottom thick external conductive layer, 60' positioned at each side of the base structure 10. The top and bottom thick external conductive layers have a thickness greater than the thickness of the internal conductive layers of the base structure in order to enhance the current and thermal capabilities of the package structure. According to a non-limiting embodiment, the thick external conductive layers 60, 60' may have a thickness of about 100 μm-4 mm, preferably about 400 μm-1 mm. The material of these layers is metal, preferably copper.

Figure 3A:
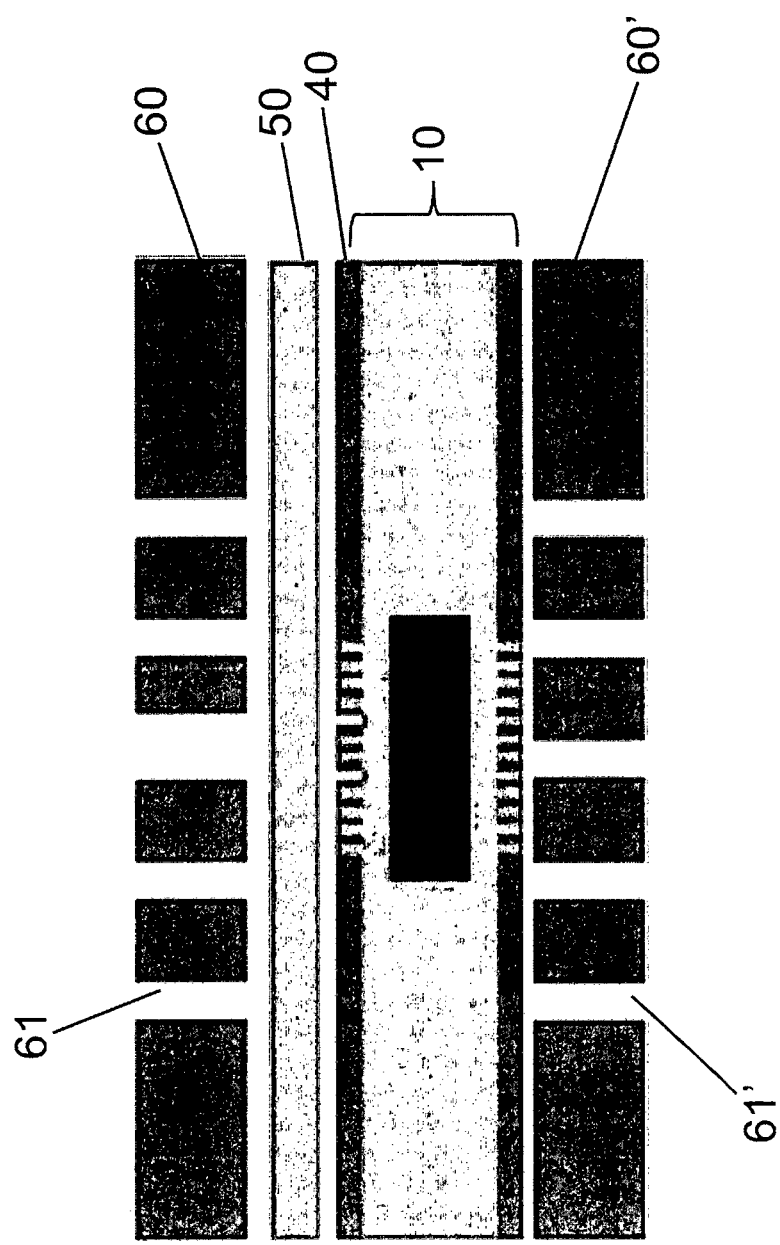
FIG. 3A is schematic cross-sectional views of an electrical power assembly according to a third embodiment of the invention.
Figure 3B:
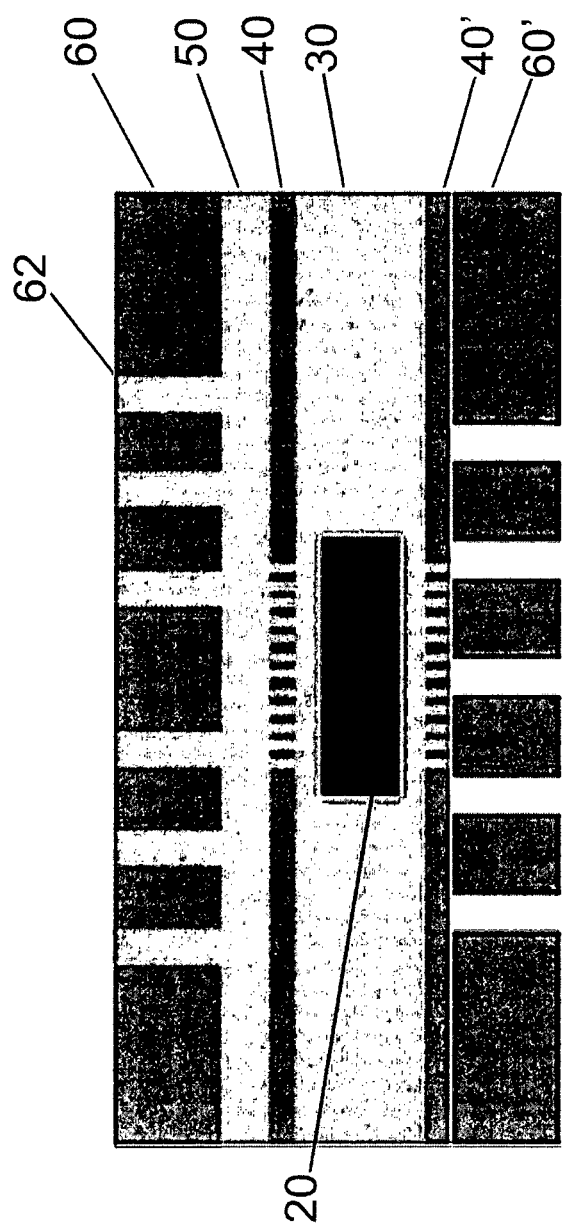
FIG. 3B is schematic cross-sectional views of an electrical power assembly according to a third embodiment of the invention.

As shown in FIG. 3A, each external thick electrically conductive layer 60, 60' comprises plural pre-drilled through holes 61, 61' which are formed by mechanical process or other appropriate technique. These predrilled through holes are served as conductive vias holes for connecting the external thick conductive layers 60, 60' to the contact pads of the internal conductive layers 40, 40' as will be explained in more details below.

Moreover, the power assembly 200 further comprises a top internal insulating layer 50 disposed between the top external thick conductive layer 60 and the top internal thin electrically conductive layer 40 of the base structure 10. For example, the internal insulating layer 50 is made of resin or any appropriate insulating material with high thermal conductivity.

Figure 3C:
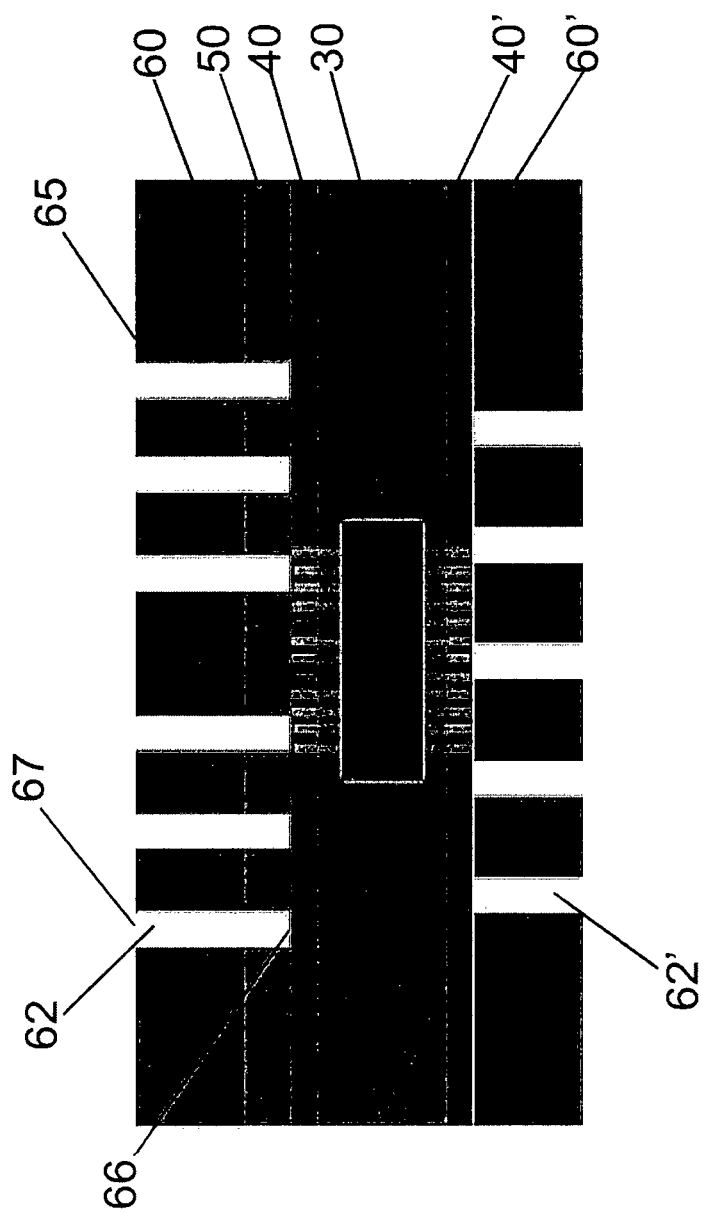
FIG. 3C is schematic cross-sectional views of an electrical power assembly according to a third embodiment of the invention.

Referring to FIG. 3C, the electrical power assembly 200 comprises a set of top holes 62 extending from the top internal layer 40, through the top insulating layer 50 and the top thick external layer 60. Thus, each top hole 62 has a bottom 66 and an open end 67. The bottom of the hole is formed by a portion of the contact pads of the top internal conductive layer 40. The open end 67 is formed at the surface 65 of the top external thick electrically conductive layer 60. Each top hole 62 is formed in part by a hole formed in the top internal insulating layer 50 and in part by the pre-drilled through hole 61 formed in the top external thick conductive layers 60.

Referring to FIG. 3C, the electrical power assembly 200 comprises also a set of bottom holes 62' extending from the bottom internal electrical layer 40' to the bottom thick external electrically layer 60'. Thus, the bottom holes 62' are formed directly by the pre-drilled holes 61' formed in the bottom external thick conductive layer 60'.

Figure 3D:
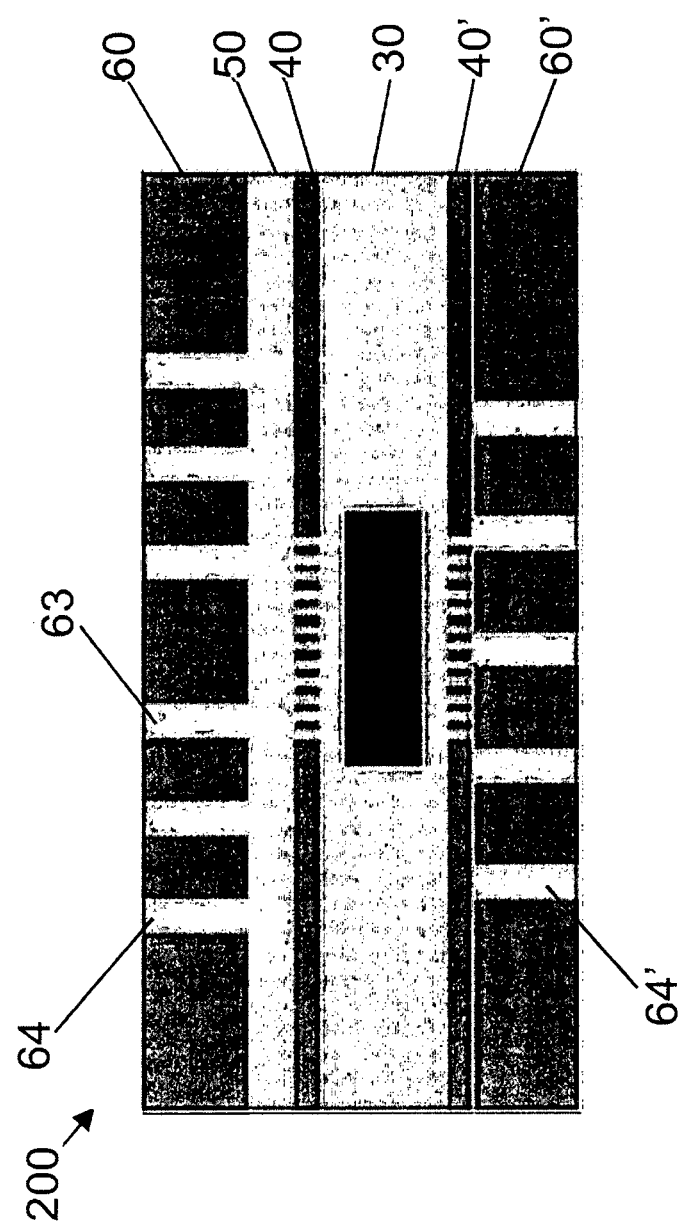
FIG. 3D is schematic cross-sectional views of an electrical power assembly according to a third embodiment of the invention.

The top and bottom holes 62, 62' are then filled by a conductive material in order to form the top conductive vias 64 and the bottom conductive vias 64'. Preferably, the holes 62, 62' may be fully filled with the conductive material from the bottom of the holes until the surface of the external thick conductive layer as shown in FIG. 3D. This step of filling allows making a mechanical adherence between the internal conductive layer 40, 40' and the respective thick conductive layers 60, 60'.

Therefore the contact pads of the top internal conductive layer 40 are connected to the top external thick conductive layer 60 by the top vias 64 arranged in the top internal insulating layer 50 and in the top external thick conductive layer 60. The contacts pads of the bottom internal conductive layer 40' are directly connected to the bottom external thick conductive layer 60' by the bottom vias 64'.

Furthermore, the top vias 64 and the bottom vias 64' provide a thermal path for heat dissipation of the power device.

Figure 4:
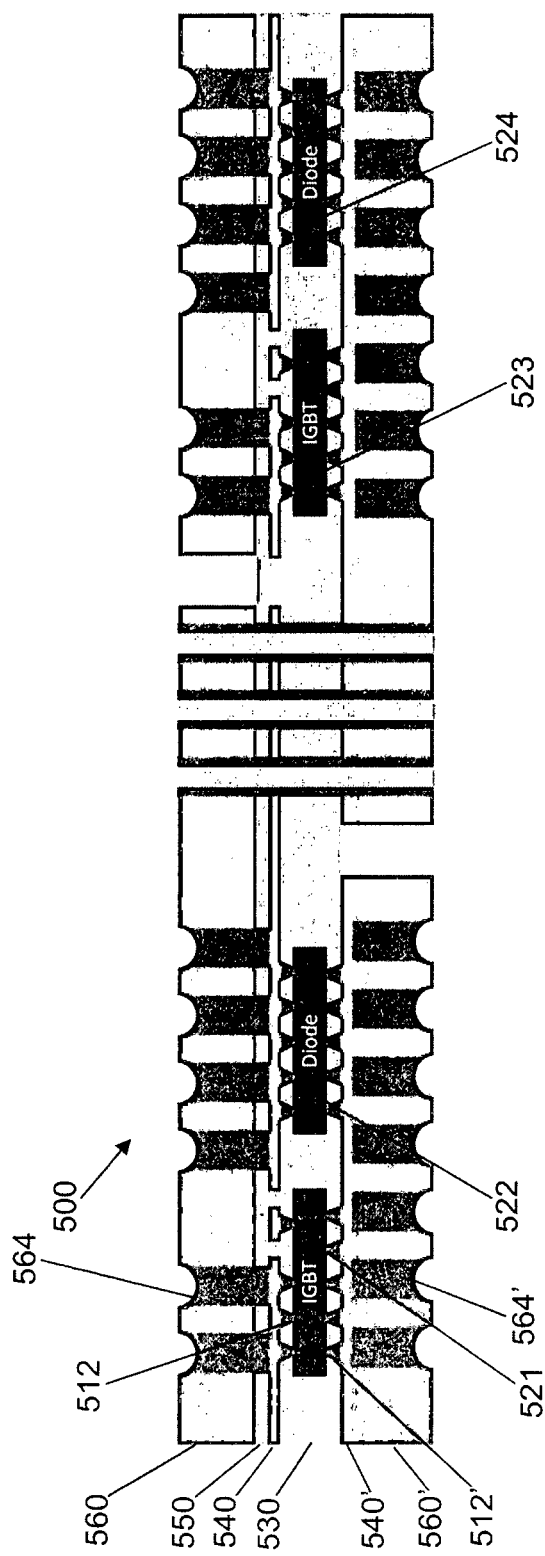
FIG. 4 is a schematic cross-sectional view of an electrical power assembly according to a fourth embodiment of the invention.

FIG. 4 is a schematic cross-sectional view illustrating a power assembly 500 according to a fourth embodiment of the present invention. In comparison with the third embodiment as shown in FIG. 3D, the power assembly of this embodiment comprises plural power devices, for instance four power devices 521, 521, 523, 524, two diodes and two IGBT. The configuration of the power devices is similar to the embodiment shown in FIG. 2.

The electrical contacts of the top side of each power device are connected to the top external thick conductive layer 560 through the top vias 512 formed in the electrically insulating core 530, the internal thin conductive layer 540, the external top vias 564 formed in the top internal insulating layer 550 and in the top external conductive layer 560. The electrical contacts of the bottom side of each power device are connected to the bottom external thick conductive layer 560' through the bottom vias 512' formed in the electrically insulating core 530, the bottom internal thin conductive layer 540', the external bottom vias 564' formed by the pre-drilled holes of the bottom external conductive layer 560'.

Figure 5A:
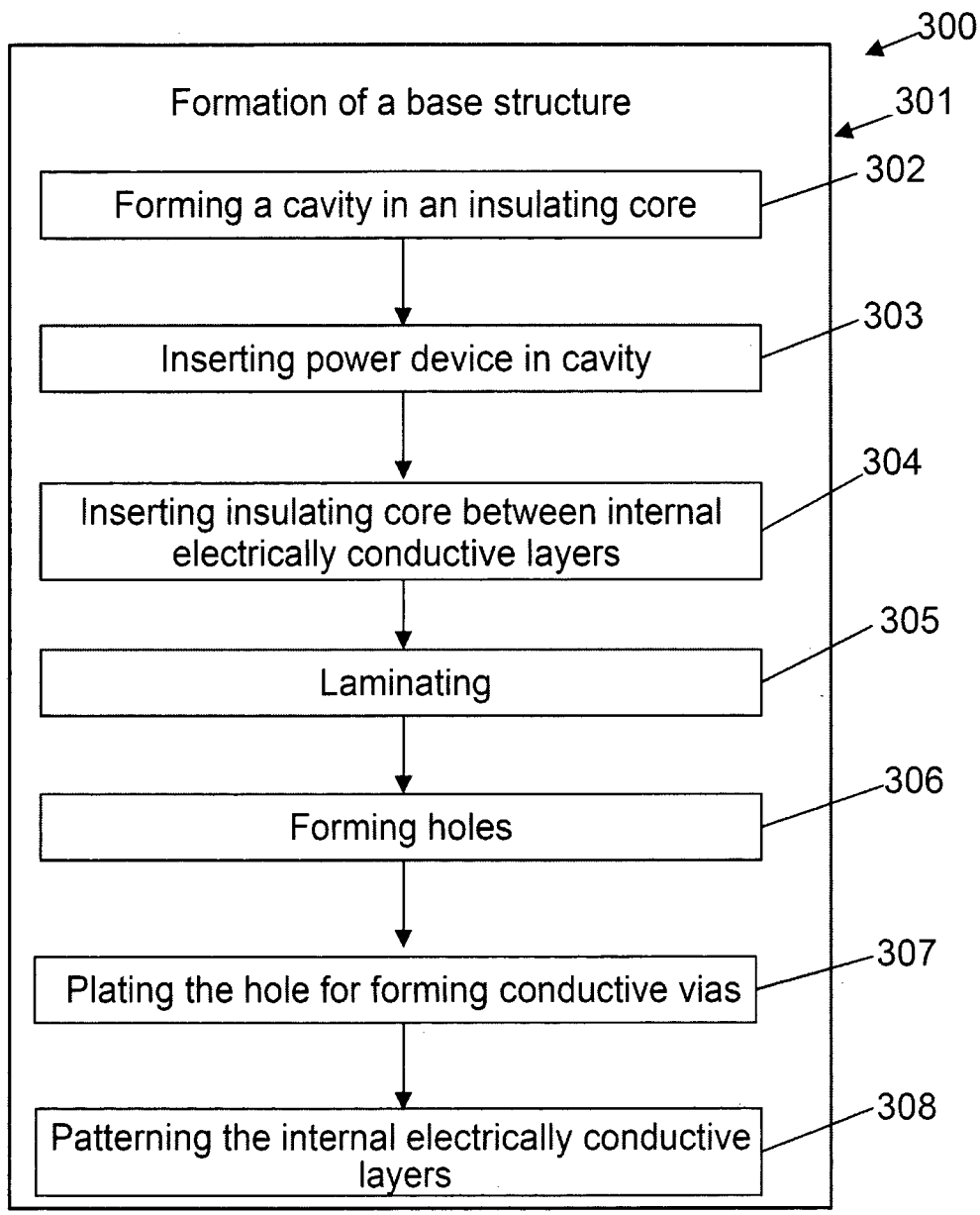
FIG. 5A schematically represents the main steps of a manufacturing method of an electrically power assembly according to an embodiment of the invention.
Figure 5B:
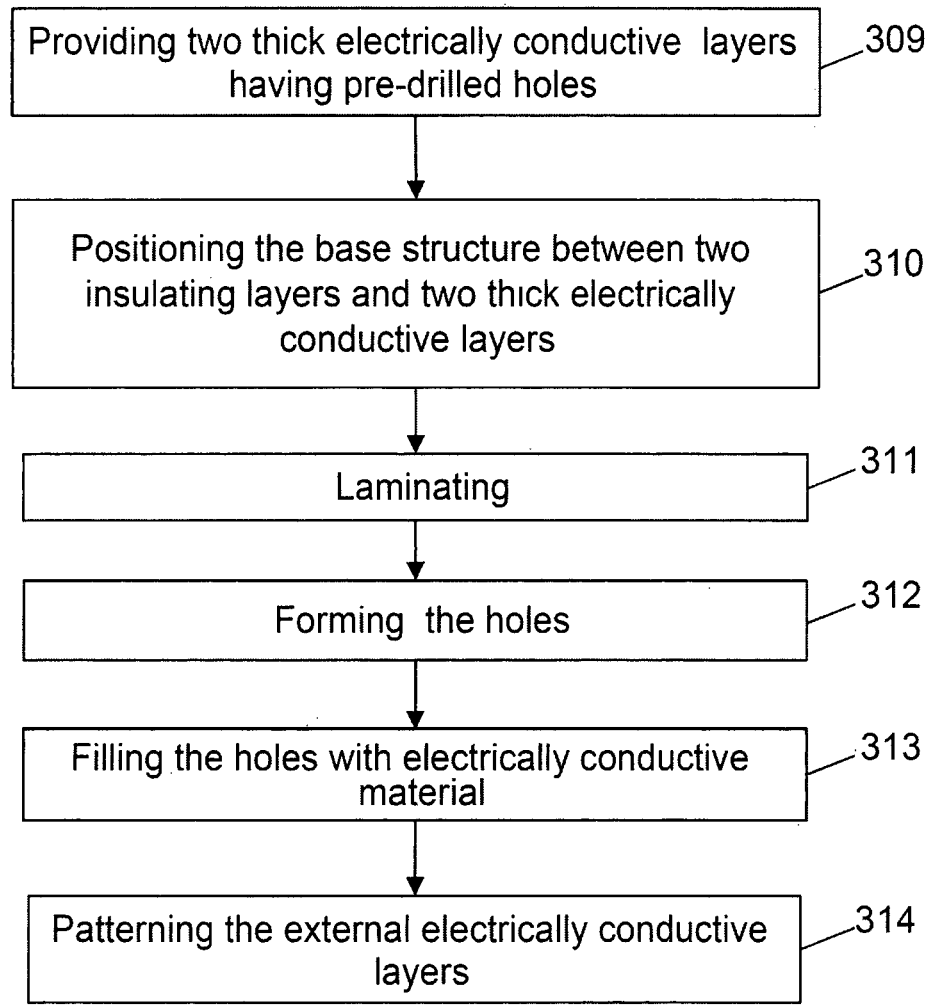
FIG. 5B schematically represents the main steps of a manufacturing method of an electrically power assembly according to an embodiment of the invention.

With reference to FIGS. 5A and 5B, a manufacturing method 300 of an electrical power assembly as shown in FIGS. 1A-1G according to an embodiment of the present invention will now be described. The method of forming the electrical assembly as shown in FIGS. 2, 3 and 4 is similar and is not redundantly described.

The FIG. 5A illustrates an example of the formation 301 of the multilayer base structure 10.

At step 302, at least one cavity is formed in an insulating core. The cavity may be obtained for instance by mechanical drilling. The shape of the cavity is adapted to the power device.

At step 303, a power device 20 is inserted in the cavity. The power device may be a diode or a transistor such as a MOSFET, JFET or IGBT and can have the various configurations of electrical contacts. Moreover the number of the power devices can be also varied according to the electronic function requirements. Each power device is oriented in the cavity in a manner that the electrical contacts of the power device are facing upwardly and downwardly. At step 304, the insulating core comprising the power device is positioned between two additional insulating layers and two thin internal conductive layers 40, 40', to obtain a stack.

At step 305, the stack of insulating layers and the conductive layers 40, 40' are laminated in order to form a solid multilayer structure, in which the insulating layers of the stack are fused together to form an insulating core 30 as shown in FIG. 1A. Thus, the power device 20 is embedded inside the insulating core 30.

The method then comprises a step 306 of forming a set of top holes 11 in the insulating core 30 and in the top internal conductive layer 40 and a set of bottom holes 11' in the insulating core 30 and in the bottom conductive layer 40'. The holes 11, 11' are formed by a laser drilling process in order to expose the electrical contacts of the power device.

At the step 307, the holes are plated with conductive material such as copper by an electroplating process in order to form conductive vias 12, 12'. The plating may be performed by electro less or/and electro plating. Preferably, the conductive material is copper. For example, the solid multilayer structure is dipped into two plating baths in order to fully fill the holes.

At the step 308, an etching step is applied on the surface of the top and bottom internal conductive layers 40, 40' in order to form the desired conductive patterns on both side of the base structure. These conductive patterns will be used as contacts pads.

At step 309, two thick conductive layers 60, 60' having pre-drilled through holes are provided. The thick conductive layers have a thickness of about 400 μm-4 mm. In contrast with the conventional method, the external electrical conductive layers comprise pre-drilled through holes which have a diameter of about 500 μm-1000 μm. As the holes are formed in the thick conductive layers prior to the step of the preparation of the stack, any appropriate drilling technique can be used. According to a preferred embodiment, the holes of the thick conductive layers are formed by a mechanical process.

At step 310, the base structure 10 is positioned between two additional internal electrically insulating layers 50, 50' and two thick external electrically conductive layers 60, 60' for forming a new stack.

According to another embodiment of the invention, at step 310, in the bottom part of the power assembly, the bottom external thick conductive layer 60' is positioned directly on the surface of the bottom internal thin conductive layer 40' as show in FIG. 3A.

At step 311, the stack comprising the base structure, the two additional internal electrically insulating layers and the two additional thick conductive layers is laminated in order to form a solid multilayer structure. The epoxy resin present in the insulating layers flows and fill the pre-drilled through holes 61, 61' of the thick external conductive layers 60, 60'.

In another embodiment, the pre-drilled through holes 61, 61' may be pre-filled with a paste insulating material during the step 308. The material may be epoxy, silicon or other any appropriate material that can be easily cleaned for the plating step.

At step 312, the insulating material in the pre-drilled through holes and underneath the pre-drilled through holes is removed in order to form holes 62, 62' extending from the internal conductive layers 40, 40' to the external surface 65, 65' of the external thick conductive layers 60, 60', through the internal insulating layers 50, 50'. Thus, each hole 62, 62' has a bottom 66, 66' formed by a portion of a contact pad of the internal conductive layers 40, 40' and an open end 67, 67' at the surface of the external thick conductive layers 60, 60'. This removing step can be performed by any appropriate process such as laser, chemical, mechanical, plasma process.

At step 313 and in reference to FIG. 1G, the holes 62, 62' are filled with conductive material 63 in order to form conductive vias 64, 64' to connect the contact pads of the internal conductive layers 40, 40' to the external thick conductive layers 60, 60'. For instance, the structure is dipped into two plating bath. The first is electroless plating in order to connect the internal thin conductive layers to the external thick conductive layers. The second bath is used to fully fill the holes with conductive material.

At step 314, the surface of the top thick conductive layer and the bottom thick conductive layer are patterned either by etching or milling. The conductive patterns may be served as contact pads for the power assembly. Consequently, several power assemblies may be inserted or integrated into another multilayer structure to form a power module.

Further, while not shown, the method may comprise further steps wherein the sequence of steps 309 to 313 is repeated at least once. Thus, the power assembly as shown in FIGS. 1G, 2, 3D and 4 can be again positioned between two additional insulating layers and thick conductive layers comprising pred-drilled holes. In another embodiment, the sequence of steps 309 to 313 may be repeated a number of times necessary to obtain a desired total thickness for the external conductive layers on each side of the base structure. This thickness which is also required for increasing the power and thermal transmission may be in a range of between 1 mm and 100 mm.

The invention claimed is:

1. An electrical power assembly, comprising:
   at least one multilayer base structure, at least one power device embedded in the at least one multilayer base structure, an internal electrically conductive layer positioned on each side of the multilayer base structure, each internal electrically conductive layer comprising at least one contact pad connected to a respective electrical contact of the power device through connections arranged in the multilayer base structure;
   at least one external electrically conductive layers positioned on each side of the base structure, each external electrically conductive layer comprising at least one through hole, the at least one of external electrically conductive layers being thicker than the internal conductive layers;
   at least one internal electrically insulating layer positioned on at least one side of the base structure, said internal electrically insulating layer being positioned between the internal electrically conductive layer of the base structure and a respective external electrically conductive layer,
   at least one hole extending from a contact pad of the internal electrically conductive layer to the external surface of the external electrically conductive layer in such that the hole has a bottom formed by a contact pad of the internal electrically conductive layer, a portion of each hole being formed by the through hole of the external electrically conductive layer,
   the at least one hole being filled with electrically conductive material from the bottom of the hole to the external surface of the external electrically conductive layer in order to form external conductive vias to connect the contact pad of the internal electrically conductive layer to the respective external electrically conductive layer.

2. The electrically power assembly according to claim 1, wherein said at least one multilayer base structure comprises:
   an electrically insulating core,
   at least one power device embedded in the electrically insulating core, each power device having opposite electrical contacts,
   two internal electrically conductive layers on opposite surfaces of the electrically insulating core,
   each internal electrically conductive layers comprising at least one contact pad connected to a respective electrical contact of the power device through connections arranged in the electrically insulating core and in the internal conductive layers.

3. The electrical power assembly according to claim 1, wherein the thickness of the external layers is in a range of between 100 μm to 4 mm, and preferably 400 μm to 1 mm.

4. The electrical power assembly according to claim 1, wherein the at least one hole have a ratio hole depth to diameter of the holes of the external electrically conductive layer, in range of between 0.4 to 1.6, and preferably 0.8 to 1.2.

5. The electrical power assembly according to claim 1, wherein the connections between an internal electrically conductive layer and an electrical contact of a power device are conductive vias.

6. The electrical power assembly according to claim 1, wherein the diameter of the at least one hole is in a range of between 100 μm to 1500 μm.

7. The electrical power assembly according to claim 1, wherein the at least one power device is a diode, a transistor such as a MOSFET, JFET or IGBT.

8. A method for manufacturing an electrical power assembly according to claim 1, comprising:
   (a) forming a multilayer base structure, at least one power device embedded in the multilayer base structure, an internal electrically conductive layer positioned on each side of the at least one base structure, each internal electrically conductive layer comprising at least one contact pad connected to a respective electrical contact of the power device through connections arranged in the multilayer base structure;
   (b) providing two external electrically conductive layers, the external electrically conductive layers having at least one pre-drilled through hole;
   (c) positioning an external electrically conductive layer on each side of the base structure and positioning at least one internal electrically insulating layer between the internal electrically conductive layer of the base structure and the external electrically conductive layer on at least one side of the base structure;
   (d) laminating the base structure, the internal electrically insulating layers and the external electrically conductive layers;
   (e) forming at least one hole by removing a stack comprising a portion of the internal electrically insulating layer and a portion of the material filling the at least one pre-drilled through hole, such that the at least one hole has a bottom formed by a contact pad of the internal electrically conductive layer;
   (f) filling the at least one hole with electrically conductive material in order to form the external conductive vias to connect the contact pad of the internal electrically conductive layer of the multilayer base structure to the external electrically conductive layer,
   (g) patterning the surface layers of external electrically conductive layers in order to form conductive patterns.

9. The method for manufacturing an electrical power assembly according to claim 8, wherein the step of forming the multilayer base structure comprises:
   forming at least one cavity in an electrically insulating core,
   inserting at least one power device in each cavity,
   positioning two internal electrically conductive layers on opposite surfaces of the electrically insulating core,
   laminating the electrically insulating core and the internal electrically conductive layers,
   forming holes in the electrically insulating core and in the internal electrically conductive layers,
   plating the holes in order to connect the at least one contact pad of the internal electrically conductive layers to a respective electrical contact of the power device,
   patterning the surface layers of internal electrically conductive layers in order to form conductive patterns.

10. The method for manufacturing an electrical power assembly according to claim 8, wherein the sequence of steps (b) to (g) is repeated at least once.

11. The method for manufacturing an electrical power assembly according to claim 8, wherein the sequence of steps (b) to (g) is repeated a number of times necessary to obtain a desired total thickness for the external conductive layers on each side of the base structure comprising between 1 mm and 100 mm.

12. The method for manufacturing an electrical power assembly according to claim 8, wherein each external electrically conductive layer have a thickness in a range of between 100 μm to 4 mm, and preferably 400 μm to 1 mm.

13. The method for manufacturing an electrical power assembly according to claim 8, wherein the at least one pre-drilled through hole of the external electrically conductive layers is pre-filled with a paste insulating material before positioning the external electrically conductive layers on each side of the base structure.

14. The method for manufacturing an electrical power assembly according to claim 13, wherein said paste insulating material is choosing among the group consisting of: epoxy resin, silicon.

15. The method for manufacturing an electrical power assembly according to claim 8, wherein the at least one hole have a ratio vias hole depth to pre-drilled hole diameter ranging between 0.4 to 1.6, and preferably between 0.8 to 1.2.

* * * * *